United States Patent
Raghu et al.

(10) Patent No.: US 7,902,081 B2
(45) Date of Patent: Mar. 8, 2011

(54) METHODS OF ETCHING POLYSILICON AND METHODS OF FORMING PLURALITIES OF CAPACITORS

(75) Inventors: Prashant Raghu, Boise, ID (US);
Vishwanath Bhat, Boise, ID (US);
Niraj Rana, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 686 days.

(21) Appl. No.: 11/580,418

(22) Filed: Oct. 11, 2006

(65) Prior Publication Data

US 2008/0090416 A1   Apr. 17, 2008

(51) Int. Cl.
*H01L 21/302* (2006.01)
(52) U.S. Cl. ............ 438/753; 438/754; 216/6; 216/104; 216/107; 216/108; 216/109
(58) Field of Classification Search .................. 438/753, 438/754; 216/6, 104, 107, 108, 109
See application file for complete search history.

(56) References Cited

U.S. PATENT DOCUMENTS

| | | |
|---|---|---|
| 4,517,729 A | 5/1985 | Batra |
| 5,236,860 A | 8/1993 | Fazan et al. |
| 5,340,763 A | 8/1994 | Dennison |
| 5,401,681 A | 3/1995 | Dennison |
| 5,467,305 A | 11/1995 | Bertin et al. |
| 5,498,562 A | 3/1996 | Dennison et al. |
| 5,532,089 A | 7/1996 | Adair et al. |
| 5,604,696 A | 2/1997 | Takaishi |
| 5,605,857 A | 2/1997 | Jost et al. |
| 5,652,164 A | 7/1997 | Dennison et al. |
| 5,654,222 A | 8/1997 | Sandhu et al. |
| 5,686,747 A | 11/1997 | Jost et al. |
| 5,702,990 A | 12/1997 | Jost et al. |
| 5,705,838 A | 1/1998 | Jost et al. |
| 5,767,561 A | 6/1998 | Frei et al. |
| 5,821,140 A | 10/1998 | Jost et al. |

(Continued)

FOREIGN PATENT DOCUMENTS

JP    08274278    10/1996

(Continued)

OTHER PUBLICATIONS

Merriam-Webster Online Dictionary, http://www.merriam-webster.com/dictionary/if ; 1 page; No date.*

(Continued)

*Primary Examiner* — Binh X Tran
(74) *Attorney, Agent, or Firm* — Wells St. John P.S.

(57) ABSTRACT

A method of etching polysilicon includes exposing a substrate comprising polysilicon to a solution comprising water, HF, and at least one of a conductive metal nitride, Pt, and Au under conditions effective to etch polysilicon from the substrate. In one embodiment, a substrate first region comprising polysilicon and a substrate second region comprising at least one of a conductive metal nitride, Pt, and Au is exposed to a solution comprising water and HF. The solution is devoid of any detectable conductive metal nitride, Pt, and Au prior to the exposing. At least some of the at least one are etched into the solution upon the exposing. Then, polysilicon is etched from the first region at a faster rate than any etch rate of the first region polysilicon prior to the etching of the at least some of the conductive metal nitride, Pt, and Au.

51 Claims, 14 Drawing Sheets

U.S. PATENT DOCUMENTS

| | | |
|---|---|---|
| 5,869,382 A | 2/1999 | Kubota |
| 5,900,660 A | 5/1999 | Jost et al. |
| 5,955,758 A | 9/1999 | Sandhu et al. |
| 5,981,350 A | 11/1999 | Geusic et al. |
| 5,990,021 A | 11/1999 | Prall et al. |
| 6,037,212 A | 3/2000 | Chao |
| 6,037,218 A | 3/2000 | Dennison et al. |
| 6,059,553 A | 5/2000 | Jin et al. |
| 6,090,700 A | 7/2000 | Tseng |
| 6,108,191 A | 8/2000 | Bruchhaus et al. |
| 6,110,774 A | 8/2000 | Jost et al. |
| 6,133,620 A | 10/2000 | Uochi |
| 6,180,450 B1 | 1/2001 | Dennison |
| 6,204,143 B1 | 3/2001 | Roberts et al. |
| 6,204,178 B1 | 3/2001 | Marsh |
| 6,258,650 B1 | 7/2001 | Sunouchi |
| 6,274,497 B1 | 8/2001 | Lou |
| 6,303,518 B1 | 10/2001 | Tian et al. |
| 6,303,956 B1 | 10/2001 | Sandhu et al. |
| 6,323,528 B1 | 11/2001 | Yamazaki et al. |
| 6,331,461 B1 | 12/2001 | Juenglling |
| 6,372,554 B1 | 4/2002 | Kawakita et al. |
| 6,372,574 B1 | 4/2002 | Lane et al. |
| 6,383,861 B1 | 5/2002 | Gonzalez et al. |
| 6,399,490 B1 | 6/2002 | Jammy et al. |
| 6,403,442 B1 | 6/2002 | Reinberg |
| 6,432,472 B1 | 8/2002 | Farrell et al. |
| 6,458,653 B1 | 10/2002 | Jang |
| 6,458,925 B1 | 10/2002 | Fasano |
| 6,459,138 B2 | 10/2002 | Reinberg |
| 6,475,855 B1 | 11/2002 | Fishburn |
| 6,482,749 B1 * | 11/2002 | Billington et al. ............ 438/745 |
| 6,617,222 B1 | 9/2003 | Coursey |
| 6,645,869 B1 | 11/2003 | Chu et al. |
| 6,656,748 B2 | 12/2003 | Hall et al. |
| 6,667,502 B1 | 12/2003 | Agarwal et al. |
| 6,673,693 B2 | 1/2004 | Kirchhoff |
| 6,707,088 B2 | 3/2004 | Fishburn |
| 6,709,978 B2 | 3/2004 | Geusic et al. |
| 6,720,232 B1 | 4/2004 | Tu et al. |
| 6,767,789 B1 | 7/2004 | Bronner et al. |
| 6,784,112 B2 | 8/2004 | Arita et al. |
| 6,784,479 B2 | 8/2004 | Park |
| 6,787,833 B1 | 9/2004 | Fishburn |
| 6,812,513 B2 | 11/2004 | Geusic et al. |
| 6,822,261 B2 | 11/2004 | Yamazaki et al. |
| 6,822,280 B2 | 11/2004 | Ito et al. |
| 6,844,230 B2 | 1/2005 | Reinberg |
| 6,849,496 B2 | 2/2005 | Jaiprakash et al. |
| 6,893,914 B2 | 5/2005 | Kim et al. |
| 6,897,109 B2 | 5/2005 | Jin et al. |
| 6,927,122 B2 | 8/2005 | Geusic et al. |
| 6,930,640 B2 | 8/2005 | Chung et al. |
| 6,962,846 B2 | 11/2005 | Fishburn et al. |
| 6,991,980 B2 | 1/2006 | Park |
| 7,005,379 B2 | 2/2006 | Sinha et al. |
| 7,042,040 B2 | 5/2006 | Horiguchi |
| 7,053,435 B2 | 5/2006 | Yeo et al. |
| 7,064,028 B2 | 6/2006 | Ito et al. |
| 7,064,365 B2 | 6/2006 | An et al. |
| 7,071,055 B2 | 7/2006 | Fishburn |
| 7,073,969 B2 | 7/2006 | Kamm |
| 7,074,669 B2 | 7/2006 | Iijima et al. |
| 7,081,384 B2 | 7/2006 | Birner et al. |
| 7,084,451 B2 | 8/2006 | Forbes et al. |
| 7,125,781 B2 | 10/2006 | Manning et al. |
| 7,153,778 B2 | 12/2006 | Busch et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 7,226,845 B2 | 6/2007 | Manning et al. |
| 7,235,441 B2 * | 6/2007 | Yasui et al. ................... 438/257 |
| 7,268,039 B2 | 9/2007 | Fishburn et al. |
| 7,273,779 B2 | 9/2007 | Fishburn et al. |
| 7,279,379 B2 | 10/2007 | Tran et al. |
| 7,288,806 B2 | 10/2007 | Tran et al. |
| 7,321,149 B2 | 1/2008 | Busch et al. |
| 7,321,150 B2 | 1/2008 | Fishburn et al. |
| 7,335,935 B2 | 2/2008 | Sinha et al. |
| 7,341,909 B2 | 3/2008 | McDaniel et al. |
| 7,384,847 B2 | 6/2008 | Tran et al. |
| 7,387,939 B2 | 6/2008 | Manning |
| 7,393,741 B2 | 7/2008 | Sandhu et al. |
| 7,413,952 B2 | 8/2008 | Busch et al. |
| 7,440,255 B2 | 10/2008 | McClure et al. |
| 7,442,600 B2 | 10/2008 | Wang et al. |
| 7,445,990 B2 | 11/2008 | Busch et al. |
| 7,449,391 B2 | 11/2008 | Manning et al. |
| 7,517,754 B2 | 4/2009 | McDaniel et al. |
| 7,538,036 B2 | 5/2009 | Busch et al. |
| 7,638,392 B2 | 12/2009 | Wang et al. |
| 2001/0012223 A1 | 8/2001 | Kohyama |
| 2001/0026974 A1 | 10/2001 | Reinberg |
| 2001/0044181 A1 | 11/2001 | Nakamura |
| 2002/0022339 A1 | 2/2002 | Kirchhoff |
| 2002/0030221 A1 | 3/2002 | Sandhu et al. |
| 2002/0039826 A1 | 4/2002 | Reinberg |
| 2002/0086479 A1 | 7/2002 | Reinberg |
| 2002/0090779 A1 | 7/2002 | Jang |
| 2002/0098654 A1 | 7/2002 | Durcan et al. |
| 2002/0153589 A1 | 10/2002 | Oh |
| 2002/0153614 A1 | 10/2002 | Ema et al. |
| 2002/0163026 A1 | 11/2002 | Park |
| 2003/0085420 A1 | 5/2003 | Ito et al. |
| 2003/0153146 A1 | 8/2003 | Won et al. |
| 2003/0178684 A1 | 9/2003 | Nakamura |
| 2003/0190782 A1 | 10/2003 | Ko et al. |
| 2003/0227044 A1 | 12/2003 | Park |
| 2004/0018679 A1 | 1/2004 | Yu et al. |
| 2004/0150070 A1 | 8/2004 | Okada et al. |
| 2004/0188738 A1 | 9/2004 | Farnworth et al. |
| 2005/0023588 A1 | 2/2005 | Sandhu et al. |
| 2005/0051822 A1 | 3/2005 | Manning |
| 2005/0054159 A1 | 3/2005 | Manning et al. |
| 2005/0158949 A1 | 7/2005 | Manning |
| 2005/0176210 A1 | 8/2005 | Kim et al. |
| 2005/0287780 A1 | 12/2005 | Manning et al. |
| 2006/0014344 A1 | 1/2006 | Manning |
| 2006/0024958 A1 | 2/2006 | Ali |
| 2006/0046420 A1 | 3/2006 | Manning |
| 2006/0051918 A1 | 3/2006 | Busch et al. |
| 2006/0063344 A1 | 3/2006 | Manning et al. |
| 2006/0063345 A1 | 3/2006 | Manning et al. |
| 2006/0115951 A1 | 6/2006 | Mosley |
| 2006/0115952 A1 * | 6/2006 | Wu ............................... 438/386 |
| 2006/0121672 A1 | 6/2006 | Basceri et al. |
| 2006/0148190 A1 | 7/2006 | Busch |
| 2006/0176210 A1 | 8/2006 | Nakamura et al. |
| 2006/0186451 A1 | 8/2006 | Dusberg et al. |
| 2006/0211211 A1 | 9/2006 | Sandhu et al. |
| 2006/0237762 A1 | 10/2006 | Park |
| 2006/0249798 A1 | 11/2006 | Manning |
| 2006/0261440 A1 | 11/2006 | Manning |
| 2006/0263968 A1 | 11/2006 | Manning |
| 2007/0032014 A1 | 2/2007 | Sandhu et al. |
| 2007/0048976 A1 | 3/2007 | Raghu |
| 2007/0093022 A1 | 4/2007 | Basceri |
| 2007/0099328 A1 | 5/2007 | Chiang et al. |
| 2007/0099423 A1 * | 5/2007 | Chen et al. .................... 438/689 |
| 2007/0145009 A1 | 6/2007 | Fucsko et al. |
| 2007/0196978 A1 | 8/2007 | Manning |
| 2007/0238259 A1 | 10/2007 | Bhat |
| 2007/0257323 A1 * | 11/2007 | Tsui et al. ...................... 257/382 |
| 2008/0090416 A1 | 4/2008 | Raghu et al. |
| 2009/0047769 A1 | 2/2009 | Bhat et al. |

FOREIGN PATENT DOCUMENTS

| | | |
|---|---|---|
| JP | 10189912 | 7/1998 |
| JP | 11191615 | 7/1999 |
| JP | 2000196038 | 7/2000 |
| JP | 2003264246 | 9/2003 |
| JP | 2003273247 | 9/2003 |
| JP | 2003297952 | 10/2003 |
| JP | 2004072078 | 3/2004 |
| JP | 2004111626 | 4/2004 |
| JP | 2004128463 | 4/2004 |
| JP | 2005032982 | 2/2005 |

| | | |
|---|---|---|
| JP | 2006-135364 | 5/2006 |
| KR | 20010061020 | 7/2001 |
| KR | 10-2001-108963 | 12/2001 |
| KR | 20010114003 | 12/2001 |
| KR | 1020030058018 | 7/2003 |
| KR | 1020050000896 | 1/2005 |
| KR | 10-520223 | 10/2005 |
| WO | WO 2005/024936 | 3/2005 |

OTHER PUBLICATIONS

Li, X. and Bohn, P.W., "*Metal-assisted chemical etching in $HF/H_2O_2$ porous silicon*", Applied Physics Letters, vol. 77, No. 16, Oct. 16, 2000, pp. 2572-2574.
US04/0027898, Aug. 26, 2004, Written Opinion.
US06/06806, Mar. 30, 2007, IPER.
PCT/US08/070071 dated Jul. 7, 2009; PCT Search Report.
PCT/US08/070071 dated Jul. 7, 2009; PCT Written Opinion.
Li et al., *Metal-assisted chemical etching in $HF/H_2O_2$ produces porous silicon*, Applied Physics Letters, vol. 77, No. 16, pp. 2572-2574 (Oct. 16, 2000).
U.S. Appl. No. 11/360,540, filed Feb. 23, 2006, Rana et al.
J. Banhart, *Aluminum Foams: On the Road to Real Applications*, MRS Bulletin, pp. 290-295 (Apr. 2003).
D. Crouse et al., *Self-Assembled Nanostructures Using Anodized Alumina Thin Films for Optoelectronic Applications*, IEEE, pp. 234-235 (1999).
L. J. Gibson, *Cellular Solids*, MRS Bulletin, pp. 270-274 (Apr. 2003).
PCT/US04/0027898, Aug. 2004, Search Rpt.
PCT/US04/0027898, Aug. 2004, Written Opinion.
D. J. Green et al., *Cellular Ceramics: Intriguing Structures, Novel Properties, and Innovative Applications*, MRS Bulletin, pp. 296-300 (Apr. 2003).
D. J. Green et al., *The Structure and Applications of Cellular Ceramics*, MRS Bulletin, 10 pages (Apr. 2003).
J. M. Karp et al., *Scaffolds for Tissue Engineering*, MRS Bulletin, pp. 301-302 (Apr. 2003).
US 04/0040252, Dec. 2004, PCT Search Rpt.
D. H. Kim et al., *A Mechanically Enhanced Storage note for virtually unlimited Height (MESH) Capacitor Aiming at sub 70nm DRAMs*, IEEE, pp. 69-72 (2004).
V. V. Konovalov et al., *Chemistry of Materials: Highly Ordered Nanotopographies on Electropolished Aluminum Single Crystals*, Chem. Mater., vol. 11, No. 8, pp. 1949-1951 (1999).
A. Kraynik, *Foam Structure: From Soap Froth to Solid Foams*, MRS Bulletin, pp. 275-278 (Apr. 2003).
J. Liang et al., *Nonlithographic Fabrication of Lateral Superlattices for Nanometric Electromagnetic-Optic . . .* , IEEE Journal of Selected topics in Quantum Electronics, vol. 8, No. 5, pp. 998-1008 (Sep./Oct. 2002).

C. Y. Liu et al., *Ordered anodic alumina nanochannels on focused-ion-beam-prepatterned aluminum surfaces*, Appl. Phys. Lett., vol. 78, No. 1, pp. 120-122 (Jan. 2001).
E. Maire et al., *In Situ X-Ray Tomography Measurements of Deformation in Cellular Solids*, MRS Bulletin, pp. 284-289 (Apr. 2003).
H. Masuda et al., *Highly ordered nanochannel-array architecture in anodic alumina*, Appl. Phys. Lett., vol. 71, No. 19, pp. 2270-2772 (Nov. 1997).
A. Nadeem et al., *Fabrication of Microstructures Using Aluminum Anodization Techniques*, pp. 274-277 (pre-2004).
English Abstract:: G. H. Oh et al., *Preparation and Pore-Characteristics Control of Nano-Porous Materials Using Organometallic Building Blocks*, Carbon Science, vol. 4, No. 1, pp. 1-9 (Mar. 2003).
P. R. Onck, *Scale Effects in Cellular Metals*, MRS Bulletin, pp. 279-283 (Apr. 2003).
U.S. Appl. No. 11/131,552, filed May 2005, Manning.
U.S. Appl. No. 11/131,575, filed May 2005, Manning et al.
U.S. Appl. No. 11/196,593, filed Aug. 2005, Sandhu et al.
J. P. O'Sullivan et al., *The morphology and mechanism of formation of porous anodic films on aluminum*, Proc. Roy. Soc. Lond. A., vol. 317, pp. 511-543 (1970).
J. M. Park et al., *Novel Robust Cell Capacitor (Leaning Exterminated Ring type Insulator) and New Storage Node Contact (Top . . .* , 2004 Symposium on VLSI Technology Digest of Technical Papers, IEEE, pp. 34-35 (2004).
M. Park et al., *Block Copolymer Lithography: Periodic Arrays of $\sim 10^{11}$ Holes in 1 Square Centimeter*, Science, vol. 276, pp. 1401-1404 (May 1997).
S. Shingubara, *Fabrication of nanomaterials using porous alumina templates*, Journal of Nanoparticle Research, vol. 5, pp. 17-30 (2003).
S. Tan et al., *High Aspect Ratio Microstructures on Porous Anodic Aluminum Oxide*, IEEE, pp. 267-272 (1995).
M. Tsukada et al., *Preparation and Application of Porous Silk Fibroin Materials*, Journal of Applied Polymer Science, vol. 54, pp. 507-514 (1994).
Yasaitis at al., "*A modular process for integrating thick polysllicon MEMS devices with sub-micron CMOS*". Analog Devices, Pre-2004, pp. 1-10.
US06/06806, Jan. 12, 2004, Search Report.
US06/06806, Aug. 26, 2004, Written Opinion.
US06/06806, Aug. 26, 2004, Response to Written Opinion.
PCT/US2008/070071, Feb. 16, 2010, IPRP.
PCT/US2004/040252, May 25, 2005, Written Opinion.

* cited by examiner

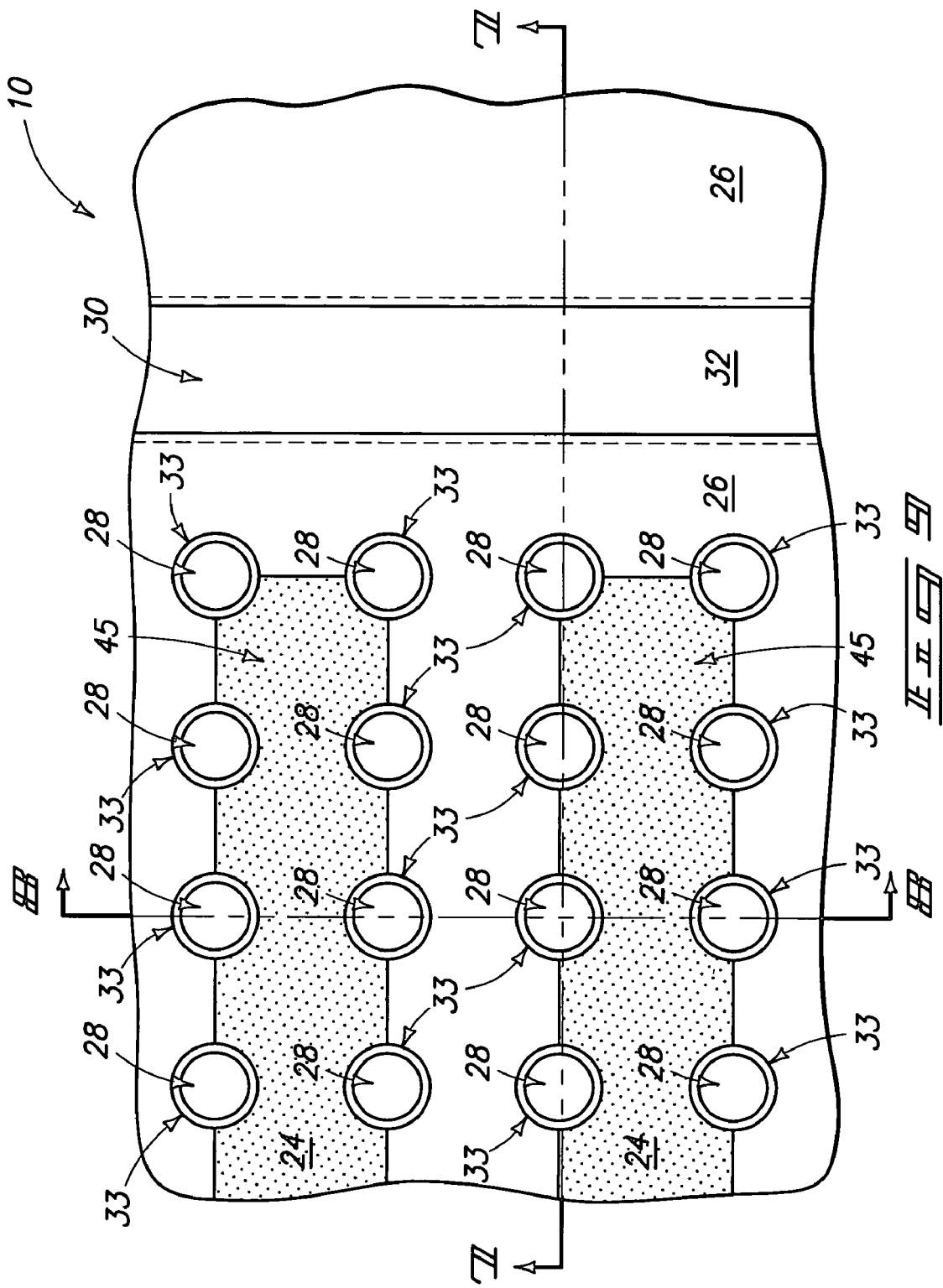

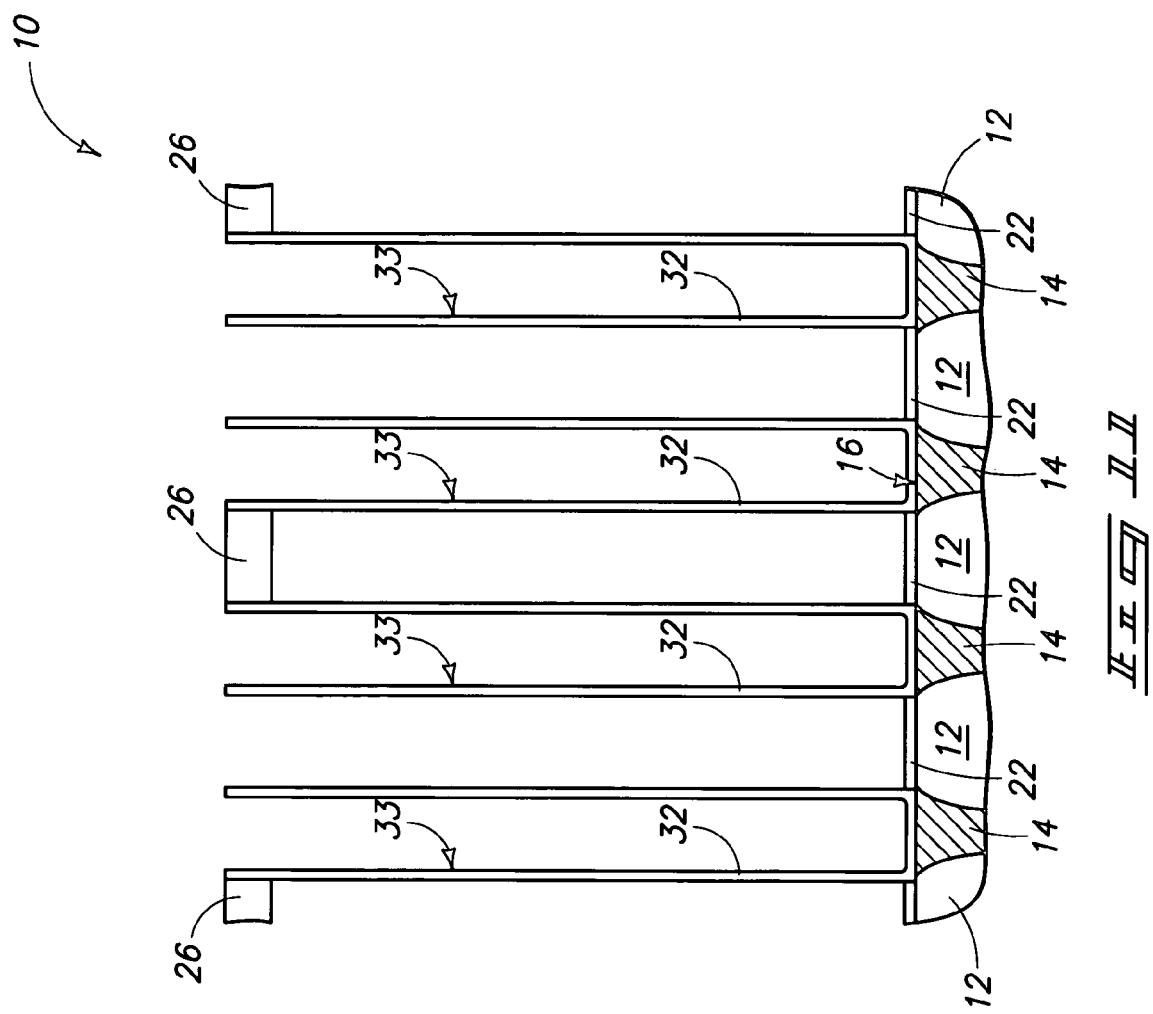

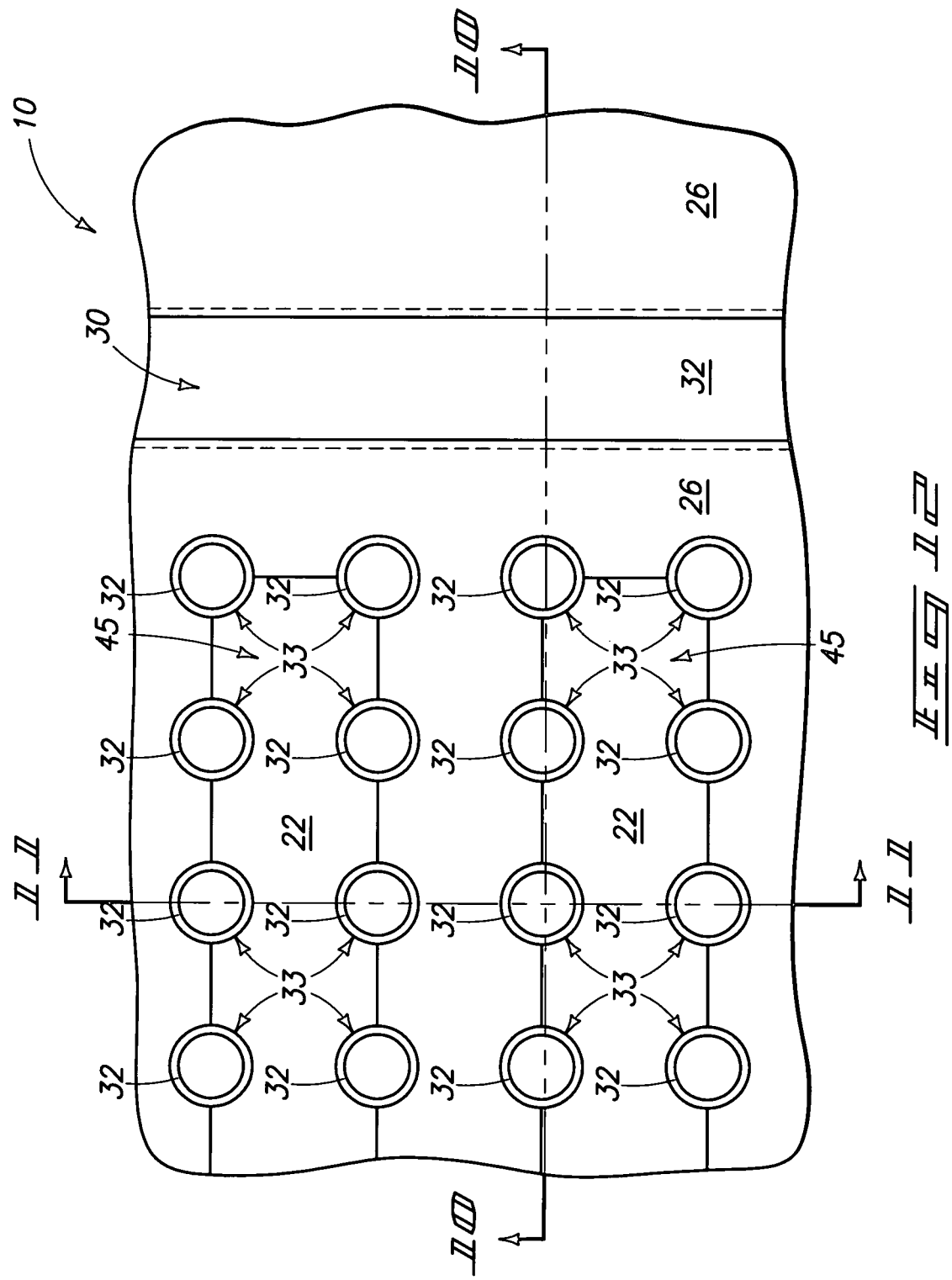

METHODS OF ETCHING POLYSILICON AND METHODS OF FORMING PLURALITIES OF CAPACITORS

TECHNICAL FIELD

Embodiments disclosed herein pertain to methods of etching polysilicon and to methods of forming pluralities of capacitors.

BACKGROUND OF THE INVENTION

Capacitors are one type of component commonly used in the fabrication of integrated circuits, for example in DRAM and other circuitry. A typical capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared to the vertical dimension. In many instances, the vertical dimension of capacitors has increased.

Several techniques have been developed to increase the storage capacity of a capacitor. One such technique is to fabricate a capacitor wherein at least one of the capacitor electrodes is double-sided and container-shaped. For example, an array of capacitor electrode openings for individual capacitors is typically fabricated in a suitable capacitor electrode-forming material, for example silicon dioxide doped with one or both of phosphorus and boron. Such openings are typically formed by dry anisotropic etching, and then lined with one or more conductive materials from which individual container-shaped capacitors are formed. It is then often desirable to etch away most if not all of the capacitor electrode-forming material to expose outer sidewall surface of the electrodes to provide increased area, and associated increased capacitance for the capacitors being formed. It may be desirable to form a lattice-like support for the capacitor electrode containers prior to etching to expose the outer container sidewalls, hopefully to preclude any subsequent toppling of the containers. For example and by way of example only, U.S. Pat. No. 6,667,502 and U.S. Published Application No. 2005/0051822 teach the provision of brace or lattice-like retaining structures intended to preclude such toppling.

Regardless, the vertical dimension of such capacitors has continued to increase while the horizontal dimension stays the same or decreases. Such dimensional variations result in the capacitor electrode openings needing to be etched deeper into the capacitor electrode-forming material. It is difficult to etch extremely deep capacitor electrode openings within doped silicon dioxides, such as phosphosilicate glass (PSG). However, doped silicon dioxides do provide the advantage of enabling a comparatively easy subsequent wet etch for exposing the outer sidewall surfaces of container-shaped electrodes.

BRIEF DESCRIPTION OF THE DRAWINGS

Some embodiments of the invention are described below with reference to the following drawings.

FIG. 4 is a diagrammatic top plan view of the FIG. 3 substrate fragment.

FIG. 9 is a diagrammatic top plan view of the FIGS. 7 and 8 substrate fragment.

FIG. 10 is a view of the FIG. 7 substrate fragment at a processing step subsequent to that shown by FIG. 7, and taken through line 10-10 in FIG. 12.

FIG. 12 is a diagrammatic top plan view of the FIGS. 10 and 11 substrate fragment.

FIG. 13 is a view of the FIG. 10 substrate fragment at a processing step subsequent to that shown by FIG. 10.

DETAILED DESCRIPTION OF THE PREFERRED EMBODIMENTS

Embodiments are described below primarily in the context of fabricating a plurality of capacitors, for example in an array of capacitors in the fabrication of DRAM. However, the invention is in no way so limited, encompassing fabrication of other integrated circuitry and encompassing any method of etching polysilicon from any substrate.

Figure 1:
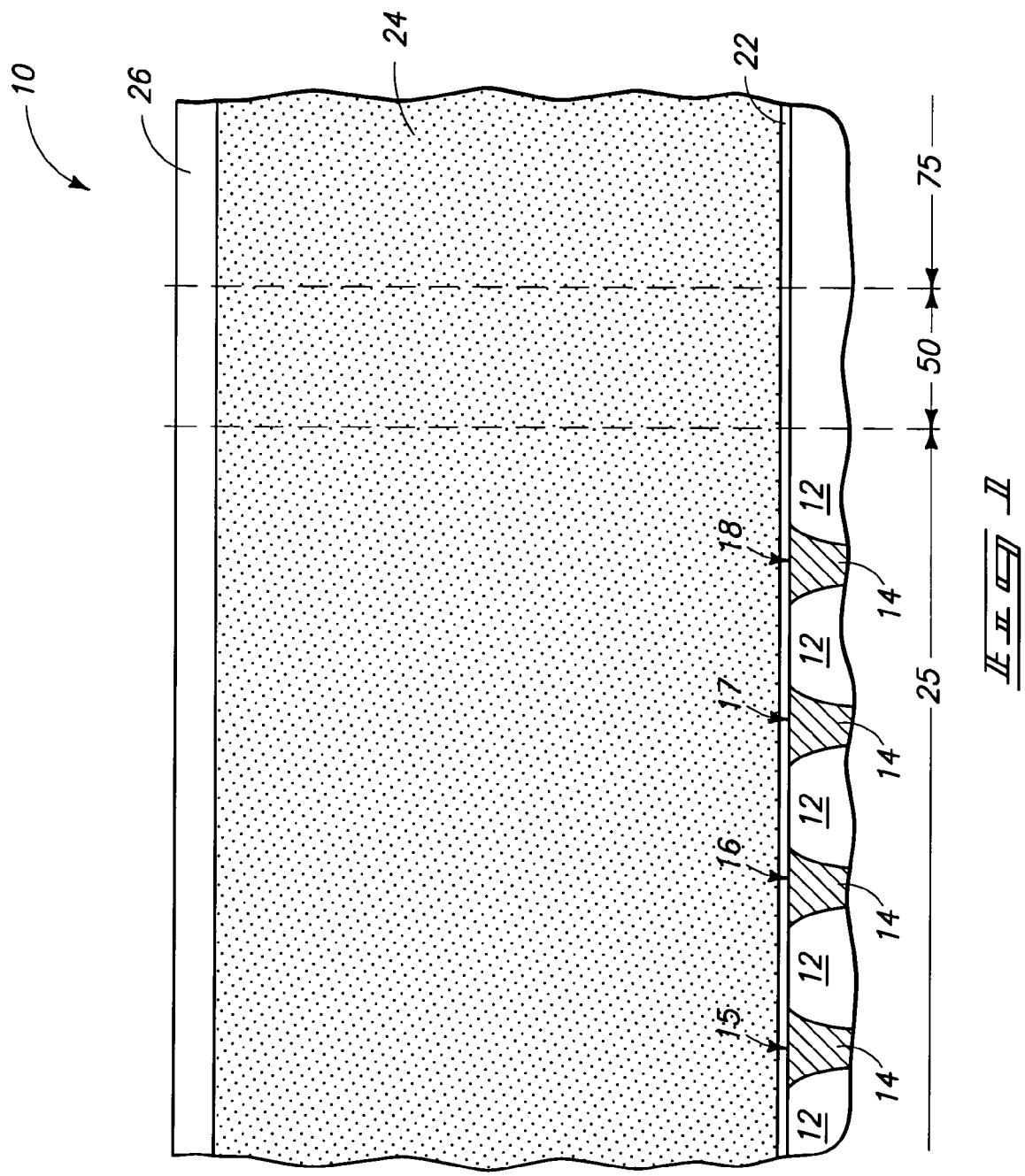
FIG. 1 is a diagrammatic cross section of a substrate fragment illustrative of commencement of processing according to an embodiment of the invention.
Figure 2:
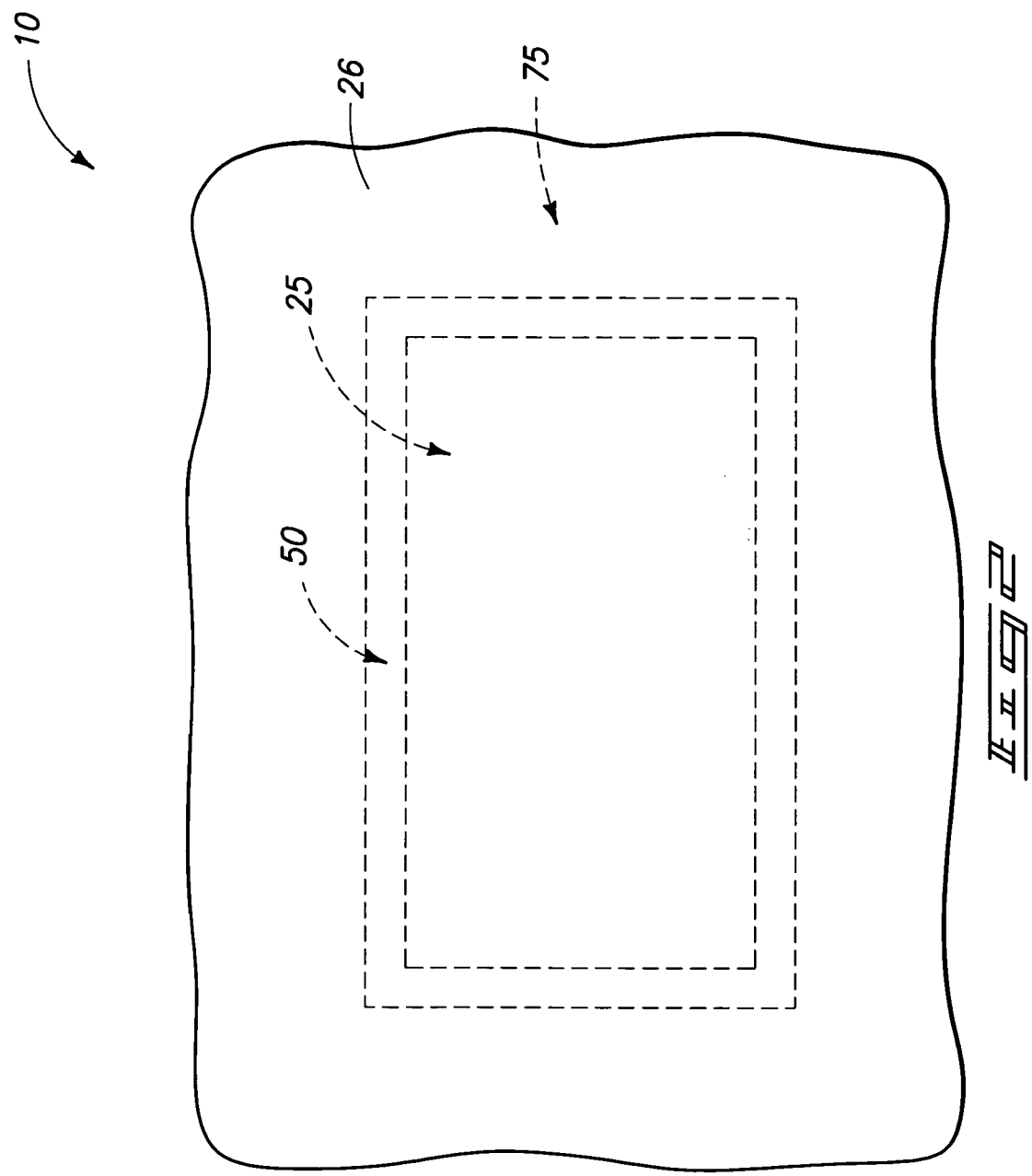
FIG. 2 is a diagrammatic top plan view of a larger scale portion of the FIG. 1 substrate.

Embodiments of methods of forming pluralities of capacitors are described with reference to FIGS. 1-14. Referring initially to FIGS. 1 and 2, a substrate, such as a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, and by way of example only, substrate fragment 10 may comprise a bulk semiconductor material (not shown), for example bulk monocrystalline, and/or comprise semiconductor-on-insulator layers or substrates.

Substrate 10 can be considered as comprising a capacitor array area 25, a circuitry area 75 other than capacitor array area 25, and an intervening area 50 between capacitor array area 25 and circuitry area 75. In the depicted embodiment, intervening area 50 completely surrounds and encircles capacitor array area 25 (FIG. 2), and circuitry area 75 comprises a peripheral circuitry area to that of capacitor array area 25. Alternate constructions are contemplated, of course, for example those configurations wherein neither intervening area 50 nor circuitry area 75 completely or partially encircles a capacitor array area 25.

FIG. 1 depicts an insulative material 12 having electrically conductive storage node pillars 14 formed therethrough.

Materials 12 and 14 may be fabricated over some suitable underlying material, for example bulk monocrystalline and/or underlying circuitry. Suitable compositions for insulative material 12 include doped and undoped silicon dioxides, for example silicon dioxide deposited by the decomposition of tetraethylorthosilicate (TEOS) and/or borophosphosilicate glass (BPSG) and/or silicon nitride. Alternatively and by way of example only, material 12 may comprise anisotropically etched insulative sidewall spacers, for example formed about transistor gate lines (not shown). One suitable material 14 is conductively doped polysilicon. Conductive material 14 may be considered as comprising or defining a plurality of capacitor storage node locations 15, 16, 17 and 18 on substrate 10. Storage node locations 15, 16, 17 and 18 are examples only, and regardless, may be conductive at this point in the process or made conductive subsequently.

A layer 22 has been formed over material 12 and capacitor storage node locations 15, 16, 17 and 18. Suitable compositions of material for layer 22 comprise silicon nitride and/or undoped silicon dioxide deposited to an example thickness range of from about 100 Angstroms to about 2,000 Angstroms. Layer 22 may be included to provide an etch stop function.

A polysilicon-comprising layer 24 is received over substrate 12/14/22. Layer 24 may be homogeneous or comprise multiple different compositions and/or layers. Suitable materials, without limitation, include those which comprise, consist essentially of, or consist of doped or undoped polysilicon, with dopant presence being with respect to a conductivity modifying impurity. In the context of this document, undoped polysilicon is polysilicon having from zero to no greater than about $1 \times 10^{14}$ atoms/cm$^3$ of a conductivity modifying impurity, for example phosphorus and/or arsenic. If doped with a conductivity modifying impurity, one total concentration range of the dopant(s) is from about $1 \times 10^{16}$ atoms/cm$^3$ to about $1 \times 10^{23}$ atoms/cm$^3$, with from about $1 \times 10^{20}$ atoms/cm$^3$ to about $1 \times 10^{22}$ atoms/cm$^3$ being more preferred. One contemplated thickness range for material 24 is from about 5,000 Angstroms to about 10 microns, with 3 microns being a specific example. Thinner and greater thicknesses are, of course, contemplated.

A layer 26 is received over polysilicon-comprising material 24. Such may comprise, consist essentially of, or consist of silicon nitride. One contemplated thickness range is from 200 Angstroms to 5,000 Angstroms. Some or all of layer 26 may be removed, or some or all of layer 26 may remain over the substrate as part of finished circuitry construction incorporating a plurality of capacitors being fabricated. Material other than silicon nitride may also be utilized, and embodiments which do not necessarily include a silicon nitride-comprising or masking layer 26 are also contemplated.

Figure 3:
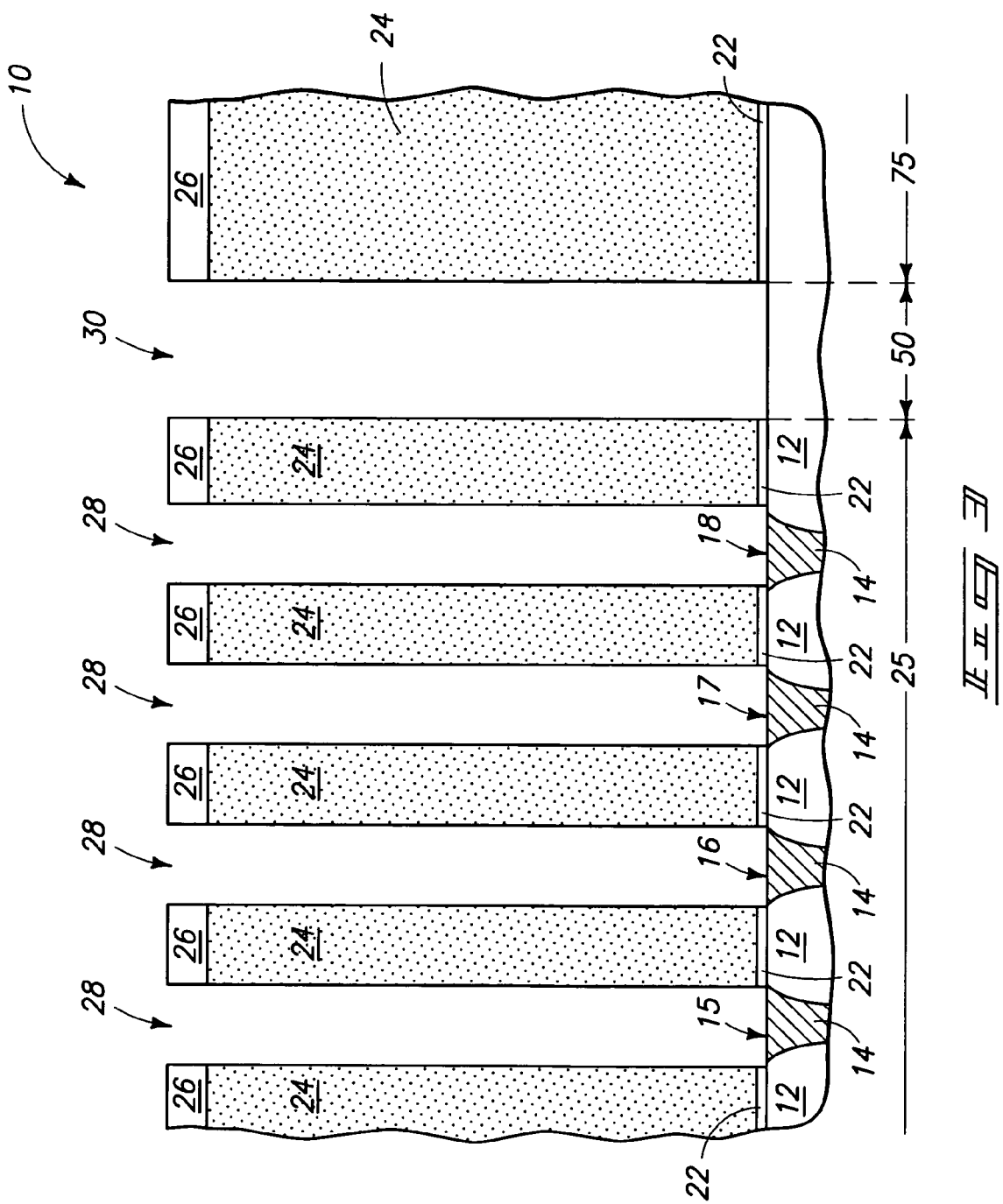
FIG. 3 is a view of the FIG. 1 substrate fragment at a processing step subsequent to that shown by FIG. 1, and taken through line 3-3 in FIG. 4.

Referring to FIGS. 3 and 4, a plurality of capacitor electrode openings 28 have been formed within silicon nitride-comprising layer 26, polysilicon-comprising layer 24, and layer 22 over individual capacitor storage node locations 15, 16, 17 and 18. Further, a trench 30 has been formed in intervening area 50 within materials 26, 24 and 22. In one embodiment, trench 30 completely surrounds capacitor area 25. One suitable technique for forming capacitor electrode openings 28 and trench 30 comprises photolithographic patterning and selective anisotropic dry etching to produce the FIGS. 3 and 4 constructions. One contemplated minimum width of trench opening 30 is from about 200 Angstroms to about 5,000 Angstroms, while another contemplated minimum width for capacitor electrode openings 28 is from about 200 Angstroms to about 5,000 Angstroms.

Figure 5:
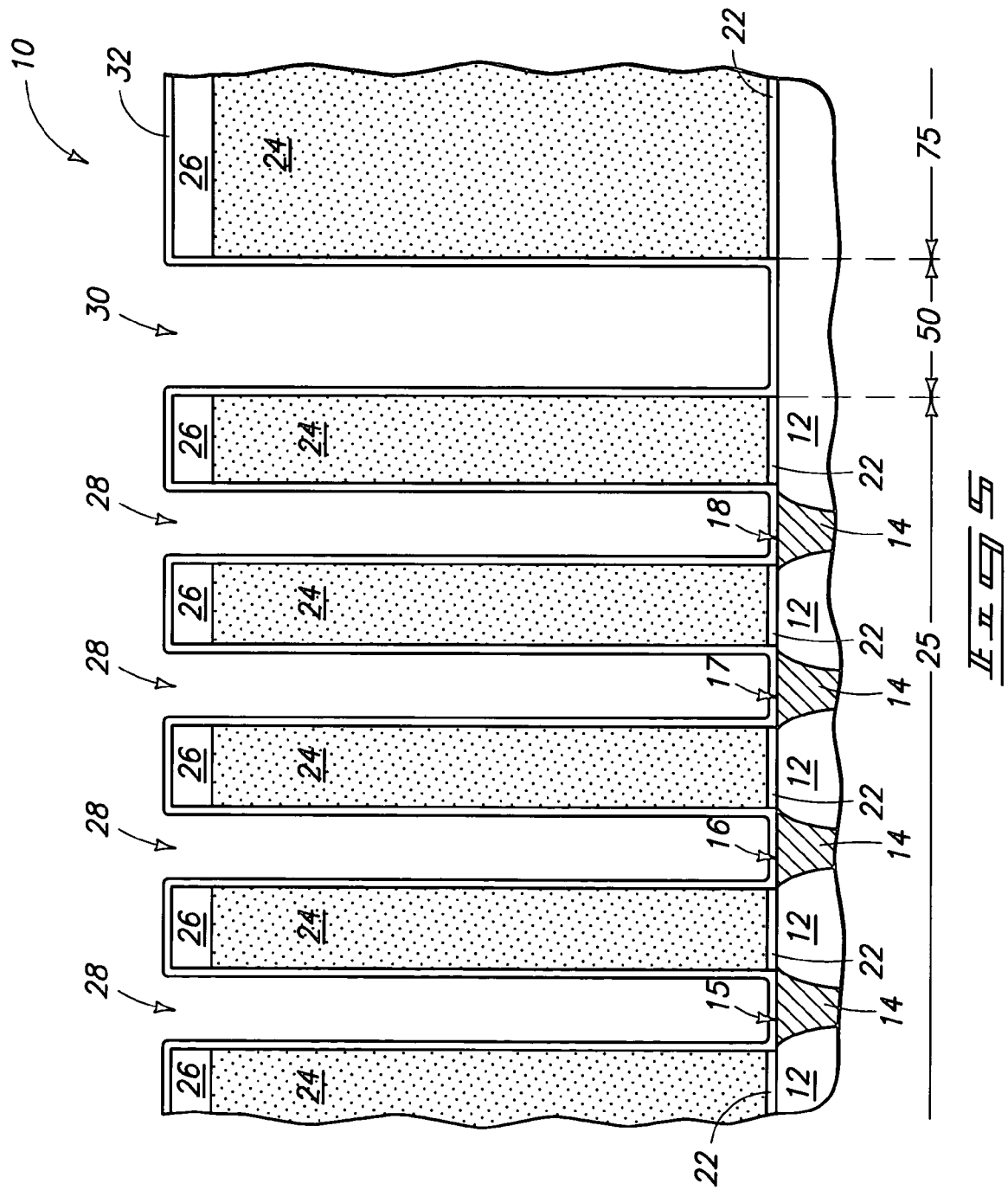
FIG. 5 is a view of the FIG. 3 substrate fragment at a processing step subsequent to that shown by FIG. 3.

Referring to FIG. 5, conductive material 32 has been formed within capacitor electrode openings 28 and within trench 30. In the depicted embodiment, conductive material 32 less than fills capacitor electrode openings 28 and trench 30. Alternately, conductive material 32 may fill capacitor electrode openings 28 and/or trench 30. One contemplated thickness range for conductive material 32 is from about 20 Angstroms to about 1,000 Angstroms. In one embodiment, conductive material 32 comprises at least one of a conductive metal nitride, Pt, and Au. Suitable conductive metal nitrides include TiN, TaN, WN, and mixtures thereof. Material 32 may comprise multiple conductive materials, for example multiple conductive metal nitrides and/or at least two of a conductive metal nitride, Pt, and Au. The use of other conductive materials alone or in combination with any one of a conductive metal nitride, Pt, and Au is also contemplated. Regardless, one preferred and reduction-to-practice conductive metal nitride is TiN.

Figure 6:
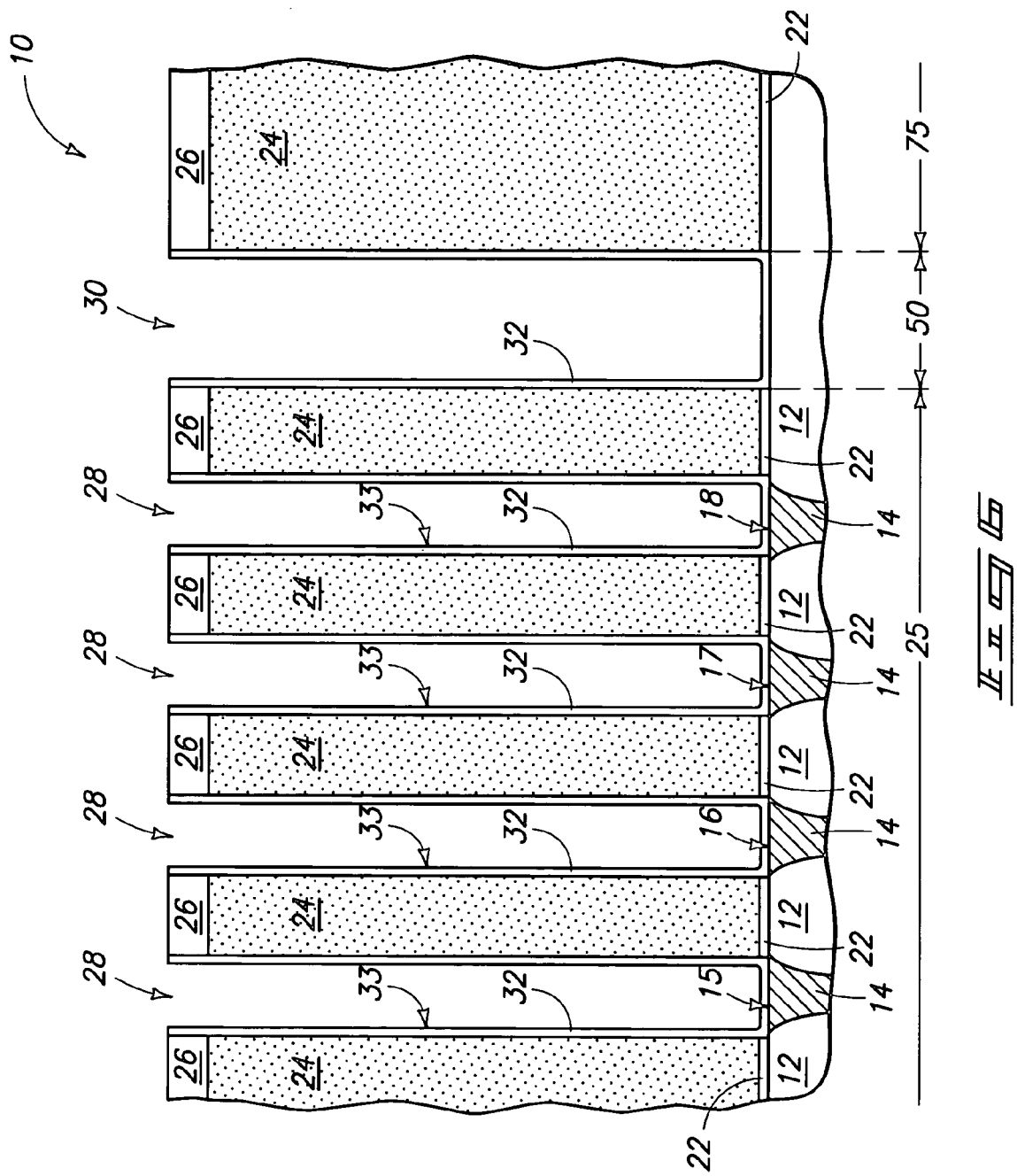
FIG. 6 is a view of the FIG. 5 substrate fragment at a processing step subsequent to that shown by FIG. 5.

Referring to FIG. 6, conductive layer 32 has been planarized back at least to an outer surface of silicon nitride-comprising layer 26, forming isolated/separate capacitor electrodes 33 within capacitor electrode openings 28 and an isolation structure within trench 30.

Such provides but one example of a method of forming individual conductive capacitor electrodes 33 (FIG. 6) within individual of the capacitor electrode openings 28. In the depicted embodiment, such capacitor electrodes are formed to comprise conductive container shapes.

Figure 7:
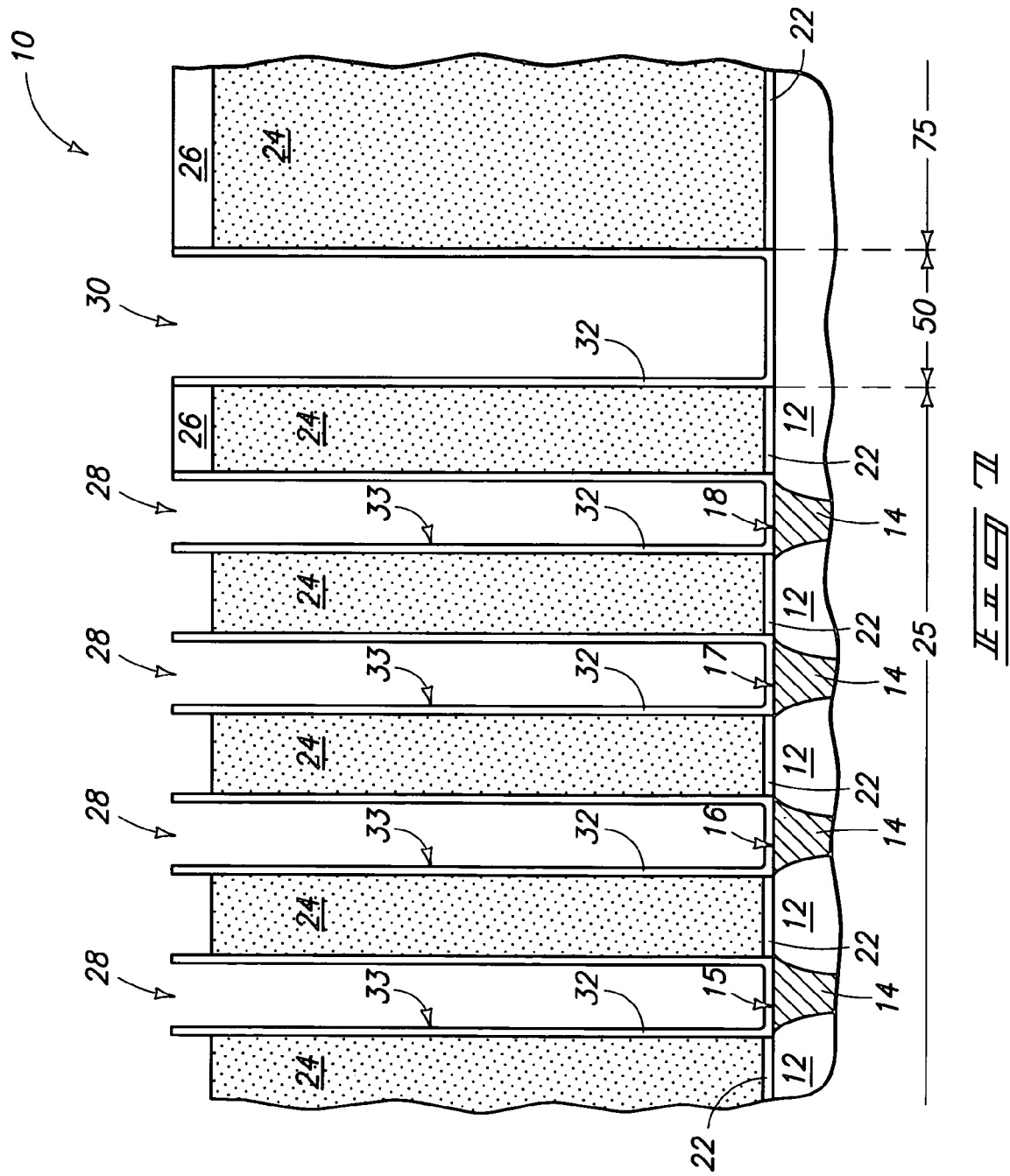
FIG. 7 is a view of the FIG. 6 substrate fragment at a processing step subsequent to that shown by FIG. 6, and taken through line 7-7 in FIG. 9.
Figure 8:
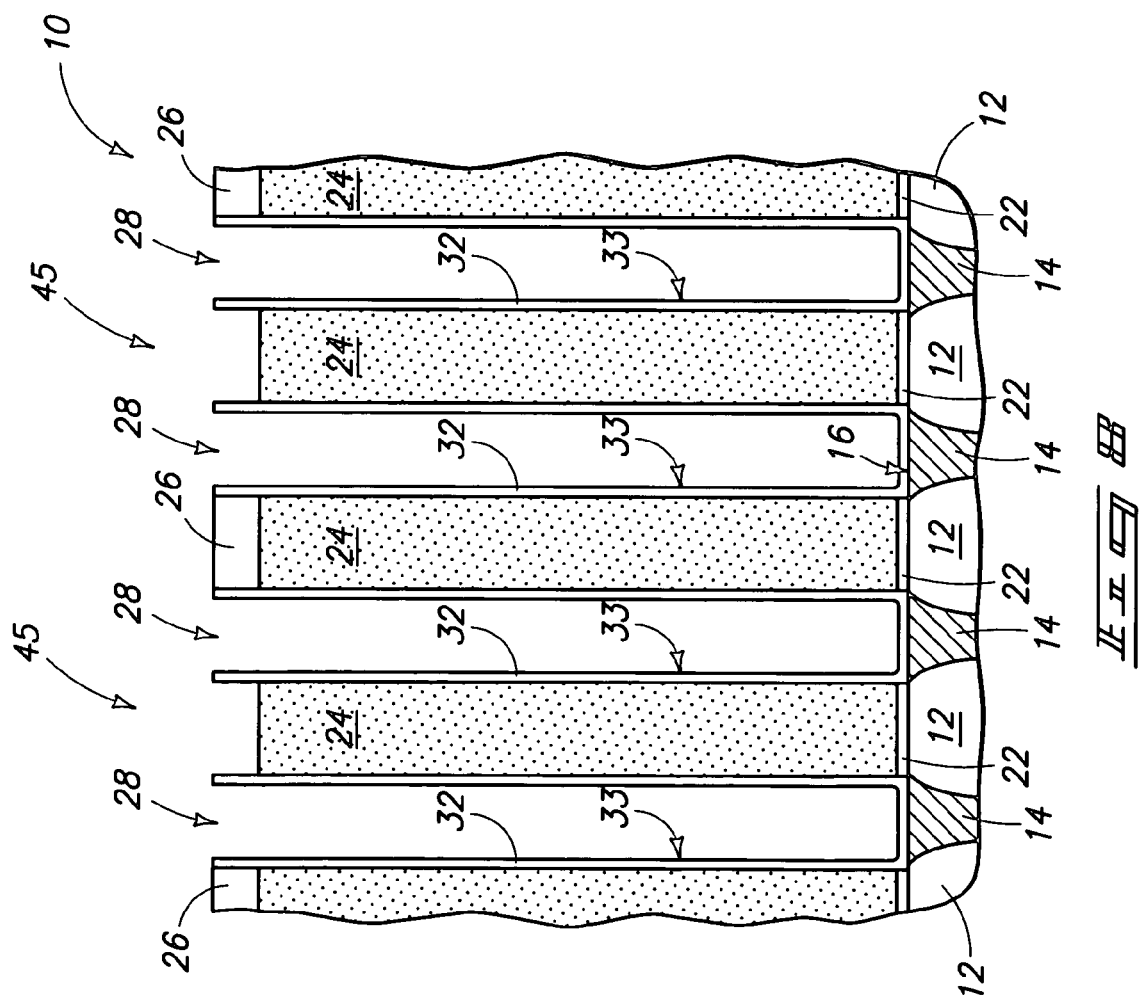
FIG. 8 is a view of the FIG. 7 substrate fragment taken through line 8-8 in FIG. 9.
Figure 11B:
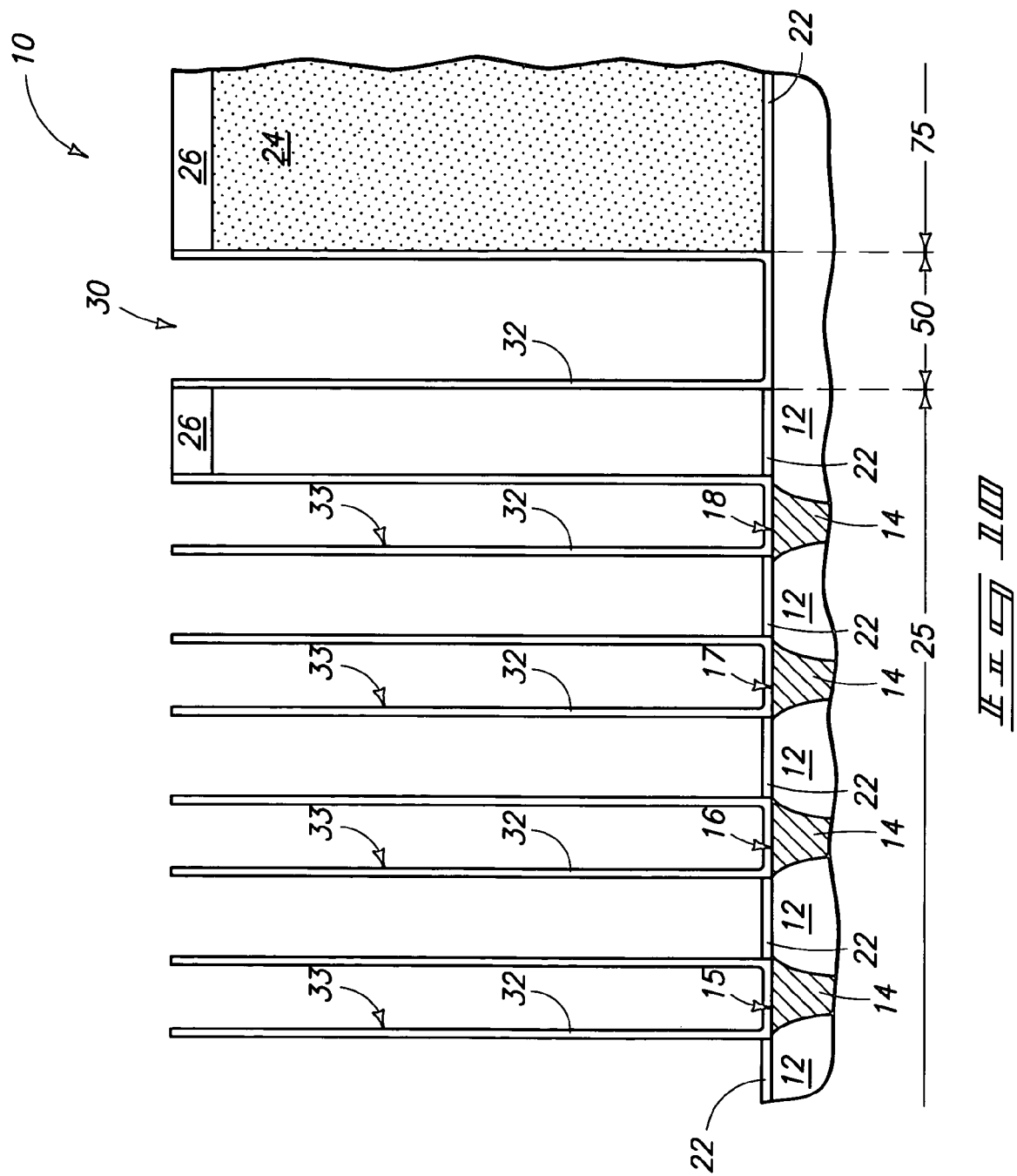
Figure 11:
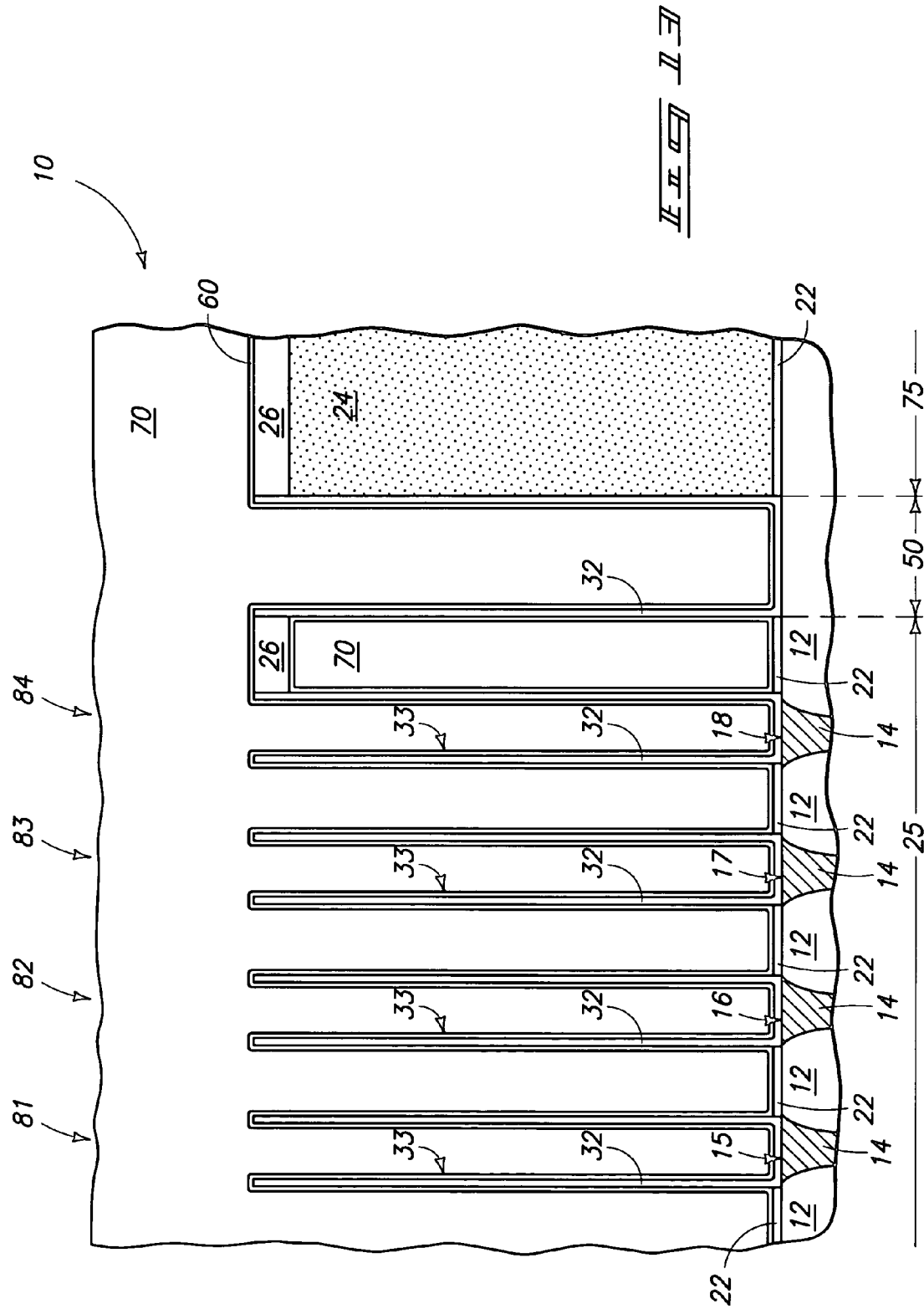

Referring to FIGS. 7-9, etch openings 45 have been formed through silicon nitride-comprising layer 26 within capacitor array area 25 effective to expose polysilicon-comprising layer 24 within capacitor array area 25 while leaving the elevationally outermost surfaces of polysilicon-comprising material 24 within circuitry area 75 completely covered with silicon nitride-comprising layer 26. Such a configuration provides access for etchant to get to and etch material 24 within capacitor array area 25.

Figure 11:
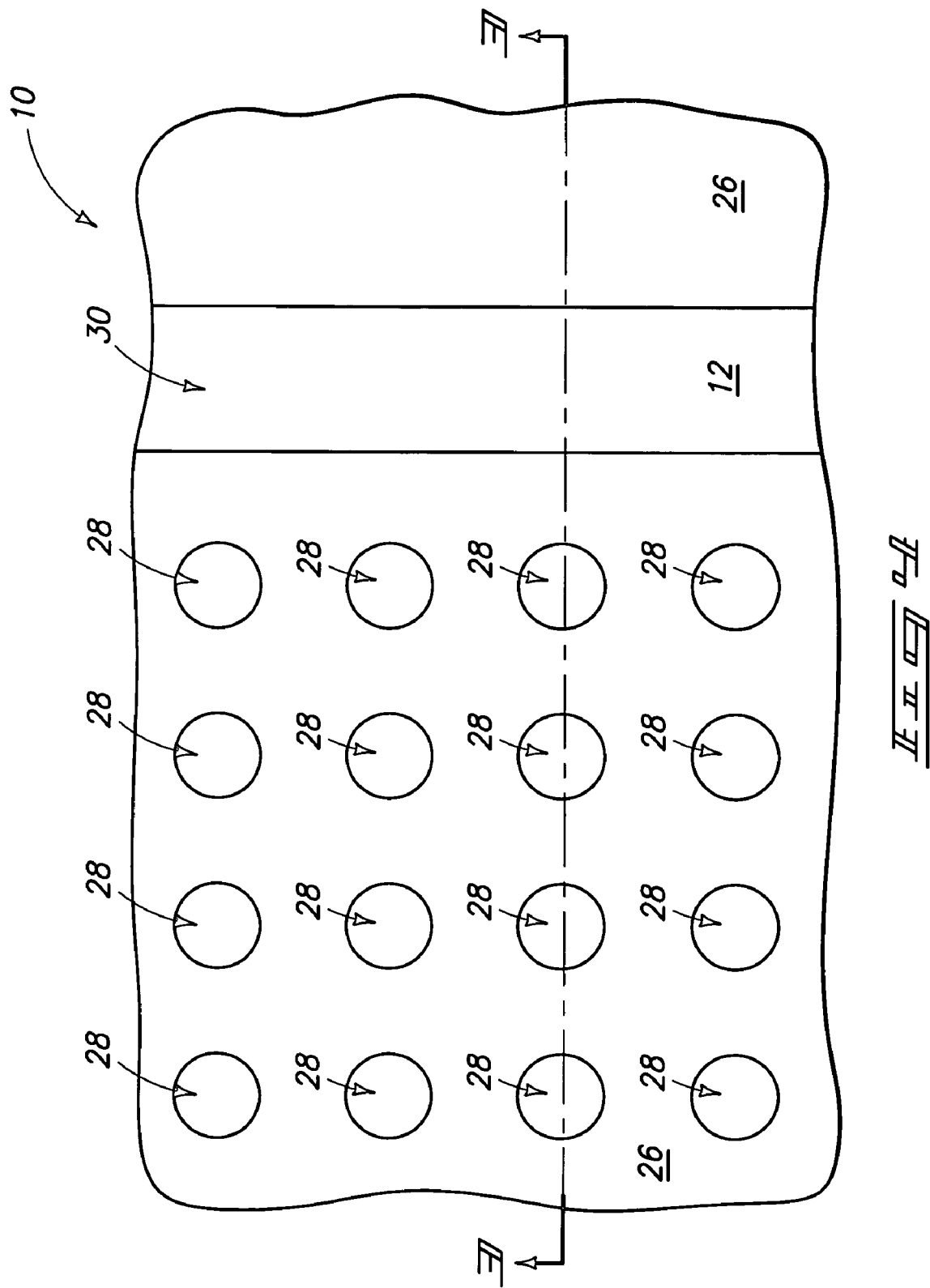
FIG. 11 is a view of the FIG. 10 substrate fragment taken through line 11-11 in FIG. 12.

Referring to FIGS. 10-12, substrate 10, including polysilicon-comprising layer 24, has been exposed to a solution comprising water and HF under conditions effective to etch polysilicon-comprising layer 24 to expose the outer sidewall portions of conductive capacitor electrodes 33. The solution also comprises at least one of a conductive metal nitride, Pt, and Au. A layer consisting essentially of doped or undoped polysilicon wet etches very slowly with etching solutions that consist essentially of water and HF, typically on the order considerably less than about 10 Angstroms per minute. Such etch rate is ineffective to appreciably expose the outer sidewall portions of a conductive capacitor electrode for fabrication of a plurality of capacitors. However, it has been discovered that presence of at least one of a conductive metal nitride, Pt, and Au can result in significantly increased etch rates of polysilicon-comprising layers. Accordingly, at least one of a conductive metal nitride, Pt, and Au is provided in the presence of the solution for etching of the polysilicon. Such at least one of conductive metal nitride, Pt, and Au may be present in the solution in one or both of solid form and/or partially or wholly dissolved therein. Suitable conductive metal nitrides are those referred to above, namely at least one of TiN, TaN, WN, and mixtures thereof.

In one embodiment of forming a plurality of capacitors, individual conductive capacitor electrodes are formed to comprise at least one of a conductive metal nitride, Pt, and Au. In one embodiment, the exposing of such to a solution comprising water and HF derives at least one of a conductive metal nitride, Pt, and Au at least in part by etching the at least one of conductive metal nitride, Pt, and Au from the conductive capacitor electrodes. For example and by way of example only, conductive metal nitrides will etch in a solution consisting essentially of water and HF at about atmospheric pressure and about 29° C. at from about 1 Angstrom to about 3 Angstroms per minute. Accordingly in one embodiment, the at least one of conductive metal nitride, Pt, and Au may result from the etching of material of the capacitor electrodes. In one embodiment, the at least one of a conductive metal nitride, Pt, and Au present in the solution may be derived only by etching the at least one of the conductive metal nitride, Pt, and Au from the conductive capacitor electrodes. Additionally, the solution to which the polysilicon-comprising layer is exposed may have been provided with at least one of a conductive metal nitride, Pt, and Au in addition to any such material going into the solution the result of any etching of such materials of the conductive capacitor electrodes. However, embodiments of the invention also contemplate methods of forming a plurality of capacitors wherein the conductive capacitor electrodes are devoid of any of the conductive metal nitride, Pt, and Au wherein such is provided in the presence of the etching solution either prior to exposure of the solution to the substrate and/or entering into solution after exposure of such from elsewhere on the substrate other than from the conductive capacitor electrodes. Regardless, in one embodiment, the etching solution, other than the inclusion of water, may be devoid of any oxidizer (i.e., devoid of any $H_2O_2$, $HNO_3$, etc.) and devoid of any $OH^-$ (i.e., devoid of any base/hydroxides).

In one embodiment, the exposing conditions are effective to etch the polysilicon-comprising layer at a rate of at least about 500 Angstroms per minute, and even more preferably at a rate of at least about 1,000 Angstroms per minute. The exposing may be effective to etch all of the polysilicon-comprising layer from the substrate, for example as shown in FIGS. 10-12, or may be ineffective to etch all of the polysilicon-comprising layer from the substrate.

An example concentration of HF in the solution is from about 2% to about 40% by weight relative to the water, and more preferably from about 5% to about 15% by weight relative to the water. The at least one of a conductive metal nitride, Pt, and Au is preferably in the solution (either as solid, dissolved, or both) at from about 0.5 weight percent to about 5 weight percent by weight relative to the water, and more preferably from about 1% to about 1.5% by weight relative to the water. Other example process conditions comprise a temperature of from about 20° C. to about 40° C., and a pressure from about 0.5 atmosphere to about 1.5 atmospheres.

The invention was reduced-to-practice with a polysilicon-comprising material that was doped with phosphorus at a concentration of about $1 \times 10^{21}$ atoms/cm$^3$, and wherein the conductive capacitor electrodes consisted essentially of TiN. Such was exposed at atmospheric pressure to a solution at about 29° C. that consisted essentially of water and HF at about 10.9% HF by weight relative to the water. Such etched about 1.5 microns of polysilicon in about 90 seconds. TiN is believed to have been etched into solution to facilitate the polysilicon etch, with TiN being present in solution in a small quantity at less than about 5% by weight relative to the water.

Conductive capacitor electrodes 33 of FIGS. 10-12 within capacitor array area 25 are incorporated into a plurality of capacitors. For example, FIG. 13 depicts the deposition of a capacitor dielectric layer 60. By way of example only, suitable materials are any one or combination of silicon dioxide, silicon nitride or any suitable high k dielectric (i.e., k greater than or equal to 5), and whether existing or yet-to-be developed. By way of example only, suitable high k dielectrics include $Ta_2O_5$ and barium strontium titanate.

Figure 14:
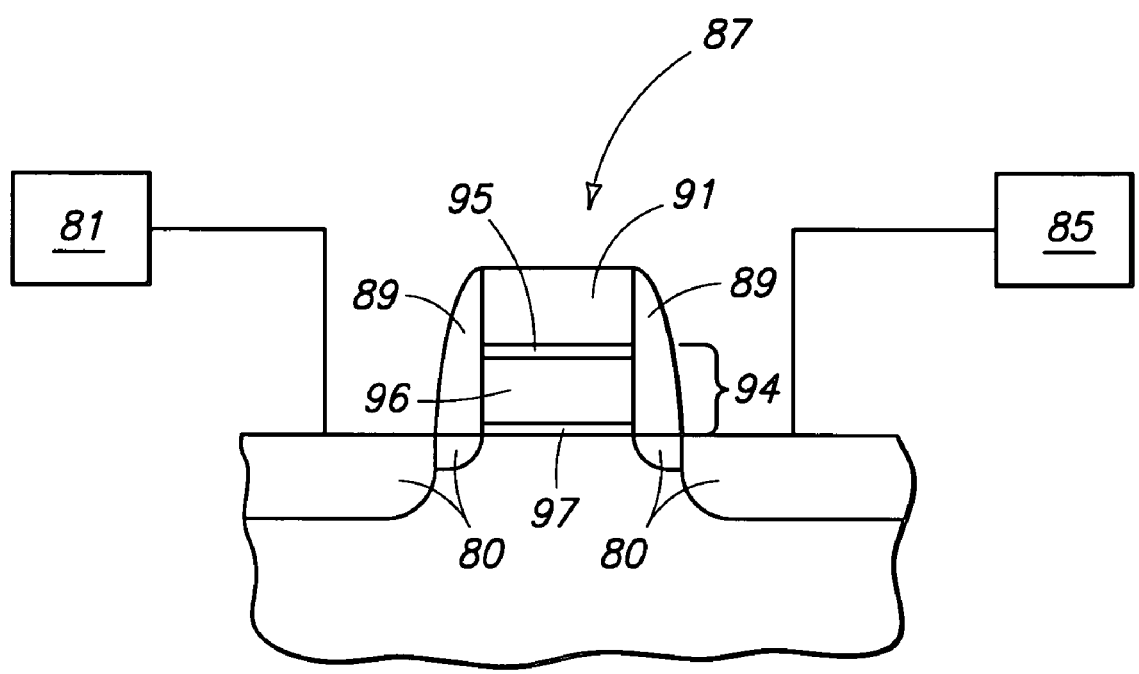
FIG. 14 is a diagrammatic representation of DRAM circuitry.

An outer capacitor electrode layer 70 has been deposited over capacitor dielectric layer 60 to define capacitors 81, 82, 83, and 84. Such are depicted as comprising a common cell capacitor plate 70 to all of the depicted capacitors, for example as may be utilized in DRAM or other circuitry, but may of course be constructed otherwise. By way of example only, FIG. 14 depicts an embodiment of a DRAM cell incorporating capacitor 81. Such comprises an example transistor gate wordline 87 having insulative sidewall spacers 89, an insulative cap 91, and a conductive region 94 under cap 91 and which includes a silicide layer 95 over a conductive polysilicon-comprising region 96. A gate dielectric region 97 is received under polysilicon-comprising region 96. Source/drain regions 80 are shown formed within semiconductive material operatively proximate wordline gate 87. One of such electrically connects with capacitor 81, and another of such electrically connects with a bitline 85.

The above-described embodiments were in the context of methods of forming pluralities of capacitors. However, embodiments of the invention encompass methods of etching polysilicon independent of capacitor fabrication. In one embodiment, a method of etching polysilicon comprises exposing a substrate comprising polysilicon to a solution comprising water, HF, and at least one of a conductive metal nitride, Pt, and Au under conditions effective to etch polysilicon from the substrate. All or only some of the polysilicon exposed to such solution may be etched from the substrate. Desirable attributes are also as described above with respect to the embodiments of FIGS. 1-13. In one embodiment, the exposing comprises providing the substrate to comprise at least one of outwardly exposed conductive metal nitride, Pt, and Au during such exposing, for example during all or only part of the exposing of the substrate to such a solution comprising at least water and HF. In one embodiment, the exposing also contemplates providing the substrate to be devoid of any outwardly exposed conductive metal nitride, Pt, and Au during all of the act of exposing. In such instance, for example, the at least one of a conductive metal nitride, Pt, and Au would be provided relative to the solution in some manner other than exposure of such a material or materials on the substrate from which polysilicon is being etched.

In one embodiment, a method of etching polysilicon from a substrate comprises exposing a substrate first region comprising polysilicon and a substrate second region comprising at least one of a conductive metal nitride, Pt, and Au to a solution comprising water and HF. By way of example only, material 24 comprises an example such first region, and material 32 comprises an example second such region. The solution is devoid of any detectable conductive metal nitride, Pt, and Au prior to the act of exposing.

At least some of the at least one of a conductive metal nitride, Pt, and Au of the second region is etched upon the act of exposing. Upon such etch, polysilicon is etched from the first region at a faster rate than any etch rate (if any etch) of the first region polysilicon prior to the etching of at least some of the material of the second region.

In one embodiment, the first region contacts the second region during the exposing. By way of example only with respect to the first-described embodiments, material 24 is depicted as contacting material 32 during the exposing. However, an embodiment of the invention also contemplates the first region and the second region being spaced from one another to be non-contacting relative to one another.

In one embodiment, the solution prior to the etching of at least some of the conductive metal nitride, Pt, and/or Au consists essentially of water and HF. Regardless, only some or all of the at least one of a conductive metal nitride, Pt, and Au may be etched from the substrate. Regardless, all or only some of the polysilicon of the first region may be etched from the substrate.

In one embodiment, a method of etching polysilicon comprises providing a substrate comprising polysilicon. An etching solution is provided which is displaced from the substrate, in other words at least initially provided in a manner in which the substrate is not contacted by the etching solution. The etching solution as so provided in displaced manner comprises water, HF, and at least one of a conductive metal nitride, Pt, and Au. The etching solution is applied to the substrate effective to etch polysilicon from the substrate.

In one embodiment, the polysilicon which is etched by the applying is exposed on the substrate prior to the applying. By way of example only, the embodiment depicted in the figures shows polysilicon material 24 at least partially being exposed on the substrate prior to exposure to the etching solution.

However, an embodiment of the invention also contemplates the polysilicon which is ultimately etched by the act of such applying not being exposed anywhere on the substrate prior to the applying. By way of example only, one or more layers may be provided over the polysilicon to be etched at the time of initially applying the etching solution to the substrate. For example and by way of example only, the polysilicon may be covered at least by an oxide (i.e., silicon dioxide) prior to the applying, with the etching solution by the act of applying to the substrate also etching the oxide. In one embodiment, the polysilicon which is etched by the applying is covered only by an oxide immediately prior to the applying, with the act of applying etching the oxide effective to expose the polysilicon. For example and by way of example only, a thin native oxide may form over the polysilicon and be etched away by exposure to the etching solution.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of etching polysilicon, comprising:
    exposing a substrate comprising polysilicon to a solution comprising water, HF, and at least one of a conductive metal nitride, Pt, and Au under conditions that etch polysilicon from the substrate; other than water, the solution being devoid of any oxidizer and devoid of any OH—; the polysilicon etching occurring at a rate of at least about 500 Angstroms per minute.

2. The method of claim 1 wherein the exposing comprises providing the polysilicon being etched to be undoped.

3. The method of claim 1 wherein the exposing comprises providing the polysilicon being etched to be doped with a conductivity modifying impurity to a concentration of from about $1\times10^{16}$ to about $1\times10^{23}$ atoms/cm$^3$.

4. The method of claim 1 wherein the exposing comprises providing the at least one of the conductive metal nitride, Pt, and Au to comprise Au.

5. The method of claim 1 wherein the exposing comprises providing the at least one of the conductive metal nitride, Pt, and Au to comprise Pt.

6. The method of claim 1 wherein the exposing comprises providing the at least one of the conductive metal nitride, Pt, and Au to comprise at least two of a conductive metal nitride, Pt, and Au.

7. The method of claim 1 wherein the exposing comprises providing the at least one of the conductive metal nitride, Pt, and Au to comprise at least two conductive metal nitrides.

8. The method of claim 1 wherein the exposing comprises providing the conditions to comprise a temperature of from about 20° C. to about 40° C., and a pressure from about 0.5 atmosphere to about 1.5 atmospheres.

9. The method of claim 1 wherein the exposing comprises providing the substrate to comprise at least one of outwardly exposed conductive metal nitride, Pt, and Au during said exposing.

10. The method of claim 1 wherein the exposing comprises providing the substrate to be devoid of any outwardly exposed conductive metal nitride, Pt, and Au during said exposing.

11. The method of claim 1 wherein the polysilicon etching occurs at a rate of at least about 1,000 Angstroms per minute.

12. The method of claim 1 wherein the exposing comprises providing the HF in the solution at from about 2% to about 40% by weight relative to the water.

13. The method of claim 4 wherein the HF in the solution is at from about 5% to about 15% by weight relative to the water.

14. The method of claim 1 wherein the exposing comprises providing the at least one of the conductive metal nitride, Pt, and Au in the solution at from about 0.5% to about 5% by weight relative to the water.

15. The method of claim 6 wherein the at least one is present in the solution at from about 1% to about 1.5% by weight relative to the water during said exposing.

16. The method of claim 1 wherein the exposing comprises providing the at least one to comprise a conductive metal nitride.

17. The method of claim 16 wherein the conductive metal nitride comprises at least one of TiN, TaN, WN, and mixtures thereof during the exposing.

18. The method of claim 17 wherein the conductive metal nitride comprises TiN during the exposing.

19. A method of etching polysilicon from a substrate, comprising:
    exposing a substrate first region comprising polysilicon and a substrate second region comprising at least one of a conductive metal nitride, Pt, and Au to a solution comprising water and HF; the first region contacting the second region and the solution being devoid of any detectable conductive metal nitride, Pt, and Au prior to the exposing;
    etching at least some of the at least one of the conductive metal nitride, Pt, and Au into the solution upon the exposing; upon etching the at least some of the at least one of the conductive metal nitride, Pt, and Au, etching polysilicon from the first region; and
    if etching of the first region polysilicon occurs prior to the etching of the at least some, then the etching of the first region polysilicon that occurs upon etching the at least some occurring at a faster rate than an etch rate of the first region polysilicon for the etching occurring prior to the etching of the at least some.

20. The method of claim 19 wherein the exposing comprises providing the polysilicon being etched to be doped with a conductivity modifying impurity to a concentration of from about $1\times10^{16}$ to about $1\times10^{23}$ atoms/cm$^3$.

21. The method of claim 19 wherein the exposing comprises providing the conditions to comprise a temperature of from about 20° C. to about 40° C., and a pressure from about 0.5 atmosphere to about 1.5 atmospheres.

22. The method of claim 19 wherein the exposing comprises providing the solution prior to said etching of the at least some to consist essentially of water and HF.

23. The method of claim 19 wherein the etching the at least some comprises etching only some of the at least one of a conductive metal nitride, Pt, and Au from the substrate.

24. The method of claim 19 wherein etching the first region polysilicon comprises etching all polysilicon that is exposed on the substrate from the substrate.

25. The method of claim 19 comprising etching the polysilicon at the faster rate of at least about 500 Angstroms per minute.

26. The method of claim 19 comprising etching the polysilicon at the faster rate of at least about 1,000 Angstroms per minute.

27. The method of claim 19 wherein other than water, the solution is devoid of any oxidizer and devoid of any $OH^-$.

28. A method of etching polysilicon, comprising:
providing a substrate comprising polysilicon;
providing an etching solution displaced from the substrate, the etching solution comprising water, HF, and at least one of a conductive metal nitride, Pt, and Au; and
applying the etching solution to the substrate which etches polysilicon from the substrate.

29. The method of claim 28 wherein the polysilicon which is etched by the applying is exposed on the substrate prior to the applying.

30. The method of claim 28 wherein other than water, the solution is devoid of any oxidizer and devoid of any $OH^-$.

31. The method of claim 28 wherein the polysilicon which is etched by the applying is not exposed on the substrate prior to the applying.

32. The method of claim 31 wherein the polysilicon which is etched by the applying is covered at least by an oxide prior to the applying, the applying etching the oxide.

33. The method of claim 32 wherein the polysilicon which is etched by the applying is covered only by an oxide prior to the applying, the applying etching the oxide to expose the polysilicon.

34. A method of forming a plurality of capacitors, comprising:
forming a polysilicon-comprising layer over a substrate;
forming capacitor electrode openings within the polysilicon-comprising layer;
forming individual conductive capacitor electrodes within individual of the capacitor electrode openings;
exposing the polysilicon-comprising layer to a solution comprising water, HF, and at least one of a conductive metal nitride, Pt, and Au under conditions that etch the polysilicon-comprising layer to expose outer sidewall portions of the conductive capacitor electrodes; and
after the exposing, incorporating the conductive capacitor electrodes into a plurality of capacitors.

35. The method of claim 34 wherein the forming the individual conductive capacitor electrodes comprises forming conductive container-shaped electrodes having inner sidewall portions opposing the outer sidewall portions.

36. The method of claim 34 wherein other than water, the solution is devoid of any oxidizer and devoid of any $OH^-$.

37. The method of claim 34 wherein the conductive capacitor electrodes are formed to comprise at least one of a conductive metal nitride, Pt, and Au; the exposing comprising deriving the at least one of a conductive metal nitride, Pt, and Au present in the solution at least in part by etching the at least one of the conductive metal nitride, Pt, and Au from the conductive capacitor electrodes.

38. The method of claim 36 wherein the exposing comprises deriving the at least one of a conductive metal nitride, Pt, and Au present in the solution only by etching the at least one of the conductive metal nitride, Pt, and Au from the conductive capacitor electrodes.

39. A method of forming a plurality of capacitors, comprising:
forming a polysilicon-comprising layer over a substrate;
forming capacitor electrode openings within the polysilicon-comprising layer;
forming individual conductive capacitor electrodes within individual of the capacitor electrode openings, the individual conductive capacitor electrodes comprising at least one of a conductive metal nitride, Pt, and Au;
exposing the polysilicon-comprising layer to a solution comprising water and HF under conditions that etch the polysilicon-comprising layer to expose outer sidewall portions of the conductive capacitor electrodes; and
after the exposing, incorporating the conductive capacitor electrodes into a plurality of capacitors.

40. A method of forming a plurality of capacitors, comprising:
forming a polysilicon-comprising layer over a substrate, the polysilicon being doped with a conductivity modifying impurity to a concentration of from $1\times10^{16}$ to $1\times10^{23}$ atoms/cm$^3$;
forming capacitor electrode openings within the polysilicon-comprising layer;
forming individual container-shaped conductive capacitor electrodes within individual of the capacitor electrode openings, the individual container-shaped conductive capacitor electrodes having inner sidewall portions opposing outer sidewall portions and comprising at least one of a conductive metal nitride, Pt, and Au;
exposing the polysilicon-comprising layer to a solution comprising water, HF, and said at least one of a conductive metal nitride, Pt, and Au under conditions that etch the polysilicon-comprising layer to expose the outer sidewall portions of the conductive container-shaped capacitor electrodes, the HF in solution being at from about 5% to about 15% by weight relative to the water, said at least one of a conductive metal nitride, Pt, and Au present in the solution being derived only by etching said at least one of the conductive metal nitride, Pt, and Au from the container-shaped conductive capacitor electrodes and being present in solution at from about 0.5% to about 5% by weight relative to the water, the solution being devoid of any oxidizer other than water and devoid of any $OH^-$ other than any from water, the conditions comprising a temperature of from about 20° C. to about 40° C. and a pressure from about 0.5 atmosphere to about 1.5 atmospheres; and
after the exposing, incorporating the conductive capacitor electrodes into a plurality of capacitors.

41. The method of claim 40 wherein the exposing comprises providing said at least one of the conductive metal nitride, Pt, and Au to comprise Au.

42. The method of claim 40 wherein the exposing comprises providing said at least one of the conductive metal nitride, Pt, and Au to comprise Pt.

43. The method of claim 40 wherein the exposing comprises providing said at least one of the conductive metal nitride, Pt, and Au to comprise a conductive metal nitride.

44. The method of claim 43 wherein the conductive metal nitride comprises at least one of TiN, TaN, WN, and mixtures thereof during the exposing.

45. The method of claim 44 wherein the conductive metal nitride comprises TiN during the exposing.

46. A method of forming a plurality of capacitors, comprising:
- forming a polysilicon-comprising layer over a substrate;
- forming capacitor electrode openings within the polysilicon-comprising layer;
- forming individual conductive capacitor electrodes within individual of the capacitor electrode openings, the individual conductive capacitor electrodes comprising TiN;
- exposing the polysilicon-comprising layer to a solution comprising water and HF under conditions that etch the polysilicon-comprising layer to expose outer sidewall portions of the conductive capacitor electrodes; and
- after the exposing, incorporating the conductive capacitor electrodes into a plurality of capacitors.

47. The method of claim 46 wherein the exposing does not etch all of said polysilicon-comprising layer from the substrate.

48. The method of claim 46 wherein the exposing etches all of said polysilicon-comprising layer from the substrate.

49. The method of claim 46 wherein other than water, the solution is devoid of any oxidizer and devoid of any $OH^-$.

50. The method of claim 46 wherein the exposing conditions etch the polysilicon-comprising layer at a rate of at least about 500 Angstroms per minute.

51. The method of claim 50 wherein the exposing conditions etch the polysilicon-comprising layer at a rate of at least about 1,000 Angstroms per minute.

* * * * *

UNITED STATES PATENT AND TRADEMARK OFFICE
CERTIFICATE OF CORRECTION

PATENT NO.        : 7,902,081 B2
APPLICATION NO.   : 11/580418
DATED             : March 8, 2011
INVENTOR(S)       : Prashant Raghu et al.

Page 1 of 1

It is certified that error appears in the above-identified patent and that said Letters Patent is hereby corrected as shown below:

In column 8, line 28, in Claim 15, delete "claim 6" and insert -- claim 14 --, therefor.

In column 10, line 1, in Claim 38, delete "claim 36" and insert -- claim 37 --, therefor.

Signed and Sealed this
Tenth Day of May, 2011

David J. Kappos
*Director of the United States Patent and Trademark Office*